United States Patent
Hsiao et al.

(10) Patent No.: US 11,658,370 B2
(45) Date of Patent: May 23, 2023

(54) SAFETY PROTECTION DEVICE AND METHOD FOR BATTERY TEST SYSTEM

(71) Applicant: NATIONAL CHUNG SHAN INSTITUTE OF SCIENCE AND TECHNOLOGY, Taoyuan (TW)

(72) Inventors: Wei-Min Hsiao, Taoyuan (TW); Chih-Hsien Chung, Taoyuan (TW); Gwo-Huei You, Taoyuan (TW); Kuo-Kuang Jen, Taoyuan (TW)

(73) Assignee: NATIONAL CHUNG SHAN INSTITUTE OF SCIENCE AND TECHNOLOGY, Taoyuan (TW)

( * ) Notice: Subject to any disclaimer, the term of this patent is extended or adjusted under 35 U.S.C. 154(b) by 240 days.

(21) Appl. No.: 17/190,437

(22) Filed: Mar. 3, 2021

(65) Prior Publication Data
US 2022/0285803 A1 Sep. 8, 2022

(51) Int. Cl.
*H01M 50/583* (2021.01)
*G01R 31/385* (2019.01)
*H01M 10/42* (2006.01)
*G01R 31/36* (2020.01)

(52) U.S. Cl.
CPC ...... *H01M 50/583* (2021.01); *G01R 31/3644* (2013.01); *G01R 31/385* (2019.01); *H01M 10/425* (2013.01); *H01M 2010/4271* (2013.01)

(58) Field of Classification Search
CPC .......... H01M 50/583; H01M 10/425; H01M 2010/4271; G01R 31/3644; G01R 31/385
USPC .......................................................... 320/116
See application file for complete search history.

(56) References Cited

U.S. PATENT DOCUMENTS

| | | | | |
|---|---|---|---|---|
| 9,761,913 | B2 * | 9/2017 | Narla | H01M 50/583 |
| 10,862,295 | B2 * | 12/2020 | Vutetakis | H01M 10/425 |
| 11,233,298 | B2 * | 1/2022 | Hinterberger | H01M 10/613 |
| 11,437,834 | B2 * | 9/2022 | Kuroda | H02J 13/00002 |
| 2009/0159354 | A1 * | 6/2009 | Jiang | H01M 50/581 |
| | | | | 180/68.5 |
| 2018/0337537 | A1 * | 11/2018 | Kadirvel | H02J 7/00304 |

* cited by examiner

*Primary Examiner* — M Baye Diao

(57) ABSTRACT

A safety protection device for a battery test system includes a system device, an alternating current changeover switch and a direct current changeover switch. The system device is coupled to a load device. One terminal of the AC changeover switch is coupled to an AC source, the other terminal of the AC changeover switch is coupled to the system device. One terminal of the DC changeover switch is coupled to a battery pack, the other terminal of the DC changeover switch is coupled to the system device. The system device detects in real time a plurality of sets of detection information of the battery pack, performs a plurality of determinations on the plurality of sets of detection information to obtain a plurality of sets of determination information. The system device respectively switches the AC changeover switch and DC changeover switch according to the plurality of sets of determination information.

2 Claims, 1 Drawing Sheet

SAFETY PROTECTION DEVICE AND METHOD FOR BATTERY TEST SYSTEM

BACKGROUND OF THE INVENTION

1. Field of the Invention

The present disclosure relates to a test system and method, and in particular to a safety protection device and method for a battery test system.

2. Description of the Related Art

In response to the rise of global energy and environmental awareness, electric buses and electric automobiles are regarded as important transportation tools developed for the future world. Thus, demands for battery testing of these electric carriers are also ever-increasing, and how to ensure the safety during charging/discharging testing of batteries is essential. A conventional battery safety protection device and a test method thereof use a voltage detection circuit and a controller coupled to the voltage detection circuit. The controller receives an external test instruction to drive a test unit to test unit to switch the changeover switch from a reference voltage source or a test voltage source, and determines according to a determination signal of a determination unit whether the voltage detection circuit operates normally. Further, a battery charging/discharging reliability test system and method control a power supply to charge the battery, and notify an electrical signal test apparatus to measure the voltage and current of the battery for multiple times; control the battery to discharge the power supply, and notify the electrical signal test apparatus to measure the voltage and current of the battery for multiple times; generate a first lifecycle curve according to the voltage value and the current value measured during charging, and generate a second lifecycle curve according to the voltage value and the current value measured during discharging; determine whether the first and second lifecycle curves match corresponding threshold lifecycle extremity characteristics curves; and if so, generate a lifecycle reliability test report of the battery; or if not, return to the step of charging. However, the method above faces several drawbacks: (1) when a battery pack is being charged, the cell voltage is not monitored in real time such that overcharging may occur to trigger battery failure and produce risks of fire and explosion; (2) in case of battery management system malfunction, a proactive power-off failure may be resulted when the voltage or temperature of the battery is in a hazardous state; (3) in case of a charger crash, charging cannot be stopped, leading in charging malfunction; and (4) although the prior art provides a comprehensive monitoring function for battery states, no details regarding mechanisms or methods regarding power-off of batteries are mentioned.

BRIEF SUMMARY OF THE INVENTION

In view of the drawbacks of the prior art above, the present invention provides a safety protection device and method for a battery test system. In the occurrence of abnormality of a battery during testing, a test apparatus initiatively performs a power-off mechanism, so as to prevent dangers caused by battery malfunction and to solve the drawbacks of the prior art above.

To achieve the object above, a safety protection device for a battery test system provided includes a system device, an alternating current (AC) changeover switch and a direct current (DC) changeover switch. The system device is coupled to a load device. One terminal of the AC changeover switch is coupled to an AC source, and the other terminal of the AC changeover switch is coupled to the system device. One terminal of the DC changeover switch is coupled to a battery pack, and the other terminal of the DC changeover switch is coupled to the system device. The system device detects in real time a plurality of sets of detection information of the battery pack, and performs a plurality of determinations on the plurality of sets of detection information to obtain a plurality of sets of determination information. Further, the system device respectively switches the AC changeover switch and the DC changeover switch according to the plurality of sets of determination information.

In the safety protection device for a battery test system according to an embodiment of the present invention, the system device includes: a measurement and automation unit, a power supply unit and a charger/discharger unit. The measurement and automation unit is electrically connected to a programmable control unit and the battery pack, respectively. The power supply unit is connected to the AC changeover switch. One terminal of the charger/discharger unit is connected to the AC changeover switch, the other terminal of the charger/discharger unit is electrically connected to a charger/discharger control unit, and the other terminal of the charger/discharger control unit is connected to the DC changeover switch.

In the safety protection device for a battery test system according to an embodiment of the present invention, the measurement and automation unit detects a plurality of sets of detection information of the battery pack, and performs a plurality of determinations on the plurality of sets of detection information to obtain a plurality of sets of determination information, and the system device respectively switches the AC changeover switch and the DC changeover switch according to the plurality of sets of determination information.

In the safety protection device for a battery test system according to an embodiment of the present invention, the measurement and automation unit and the programmable control unit achieve a synchronous counter function in between by using a pulse width modulation (PWM) signal. When abnormality occurs in the measurement and automation unit, the programmable control unit transmits a digital signal to the AC changeover switch to perform disconnection.

In the safety protection device for a battery test system according to an embodiment of the present invention, the battery pack sends battery information to the measurement and automation unit by a controller region device, and the system device switches the DC changeover switch according to the battery information.

In the safety protection device for a battery test system according to an embodiment of the present invention, the plurality of determinations include a battery temperature threshold, a voltage threshold and a current threshold.

In the safety protection device for a battery test system according to an embodiment of the present invention, the plurality of sets of detection information include a battery instantaneous temperature, an instantaneous voltage and an instantaneous current.

In the safety protection device for a battery test system according to an embodiment of the present invention, the battery information includes a battery instantaneous temperature, an instantaneous voltage and an instantaneous current.

To achieve the object above, a safety protection method for a battery test system includes: using a system device to detect in real time a plurality of sets of detection information of a battery pack and to perform a plurality of determinations on the plurality of sets of detection information to obtain a plurality of sets of determination information, and the system device respectively switching an alternating current (AC) changeover switch and a direct current (DC) changeover switch according to the plurality of sets of determination information, wherein the system device is coupled to a load device, the AC changeover switch is coupled between an AC source and the system device, and the DC changeover switch is coupled between the battery pack and the system device; and enabling a measurement and automation unit and a programmable control unit of the system device to achieve a synchronous counter function in between by using a pulse width modulation (PWM) signal, and the programmable control unit transmits a digital signal to the AC changeover switch to perform disconnection when abnormality occurs in the measurement and automation unit.

In the safety protection method for a battery test system according to an embodiment of the present invention, wherein the battery pack sends battery information to the measurement and automation unit by a controller region device, and the system device switches the DC changeover switch according to the battery information.

The summary above and details and accompanying drawings below are for further describing approaches, means and effects for achieving the expected object of the present invention. Other objects and advantages of the present invention are to be illustrated in the following description and drawings.

DETAILED DESCRIPTION OF THE INVENTION

To facilitate understanding of the object, characteristics and effects of this present disclosure, embodiments together with the attached drawings for the detailed description of the present disclosure are provided.

Figure 1:
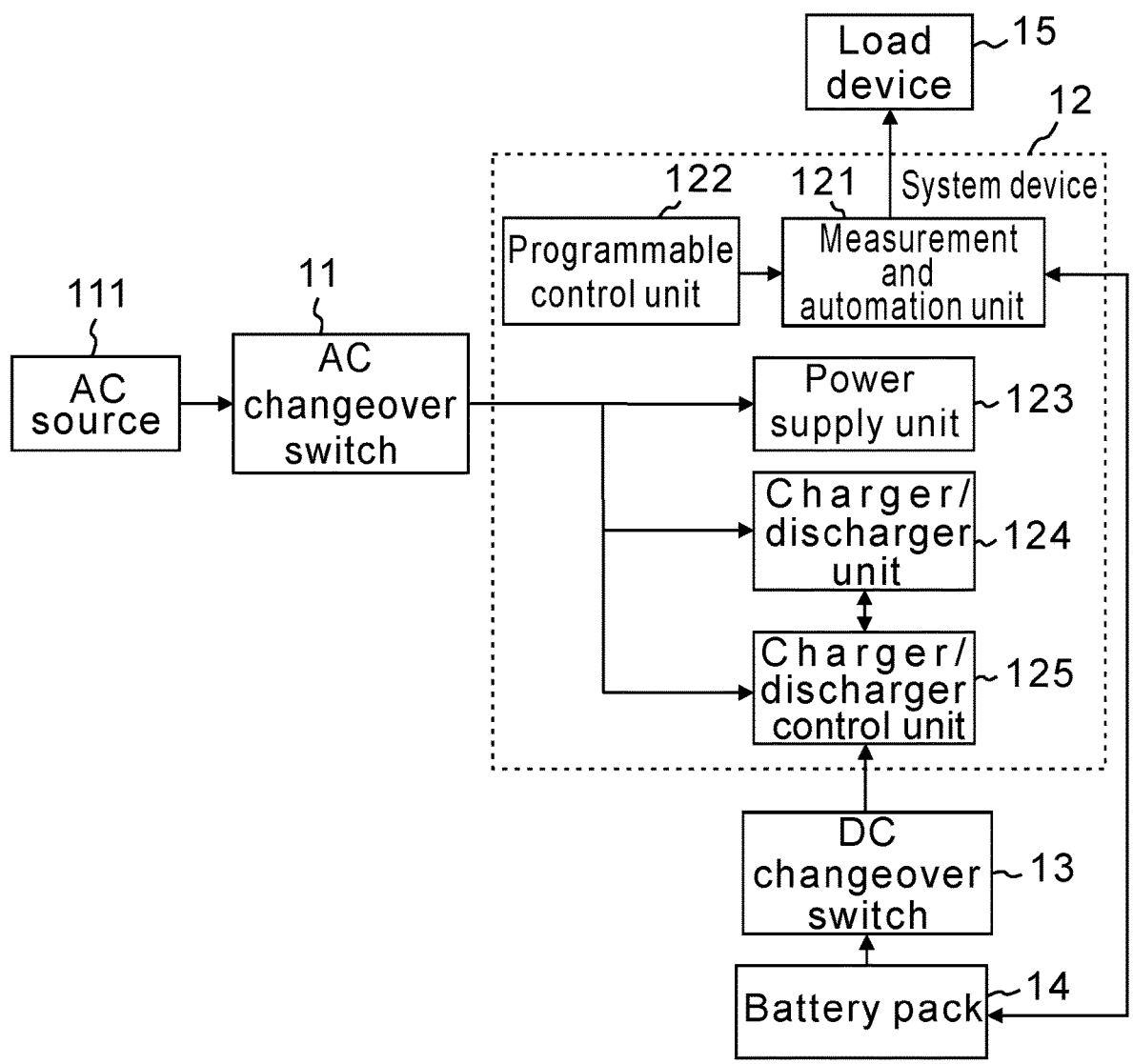
FIG. 1 is a schematic diagram of a safety protection device for a battery test system of the present invention.

FIG. 1 shows a schematic diagram of a safety protection device for a battery test system of the present invention. Referring to FIG. 1, the safety protection device for a battery test system includes an alternating current (AC) changeover switch 11, a system device 12, and a direct current (DC) changeover switch 13. One terminal of the AC changeover switch 11 is coupled to an AC source 111, and the other terminal of the AC changeover switch 11 is coupled to the system device 12. One terminal of the DC changeover switch 13 is coupled to a battery pack 14, and the other terminal of the DC changeover switch 13 is coupled to the system device 12. The system device 12 is coupled to a load device 15. The system device 12 detects in real time a plurality of sets of detection information of the battery pack 14, and performs a plurality of determinations of the plurality of sets of detection information to obtain a plurality of sets of determination information. Further, the system device 12 respectively switches the AC changeover switch 11 and the DC changeover switch 13 according to the plurality of sets of determination information.

In a preferred embodiment, thresholds of the plurality of determinations include a battery temperature threshold, a voltage threshold and a current threshold. The plurality of sets of detection information include a battery instantaneous temperature, an instantaneous voltage and an instantaneous current. The battery information includes a battery instantaneous temperature information, an instantaneous voltage and an instantaneous current. The plurality of determinations, the plurality of sets of detection information and the plurality of sets of determination information are not limited by the embodiments above. The plurality of determinations include comparison between the battery instantaneous temperature and a battery temperature threshold, comparison between the battery instantaneous voltage and a voltage threshold, and comparison between the battery instantaneous current and a current threshold. For example, determination conditions may be that, when the battery instantaneous temperature is more than or less than a specified threshold (in a unit of ° C. or ° F.), for example, when the battery instantaneous temperature is more than 45° C. or when the instantaneous temperature is less than 10° C., a protection mechanism is activated; when the battery instantaneous voltage is more than or less than a specified threshold (in a unit of V), for example, when the battery instantaneous current is more than 4.1V or the instantaneous voltage is less than 3.0 V, a protection mechanism is activated; when the battery instantaneous current is more than a specified threshold (in a unit of A), for example, when the battery instantaneous current is more than 100 A, a protection mechanism is activated. In some embodiments, the system device 12 may be configured to appropriately switch the AC changeover switch 11 and the DC changeover switch 13 according to at least one, multiple or all of the exemplary determination conditions above so as to produce a protection effect.

For example, the system device 12 includes a measurement and automation unit 121, a programmable control unit 122, a power supply unit 123, a charger/discharger unit 124, and a charger/discharger control unit 125. The measurement and automation unit 121 is electrically connected to the programmable control unit 122 and the battery pack 14, respectively. The power supply unit 123 is connected to the AC changeover switch 11. One terminal of the charger/discharger unit 124 is connected to the AC changeover switch 13, the other terminal of the charger/discharger unit 124 is electrically connected to the charger/discharger control unit 125, and the other terminal of the charger/discharger control unit 125 is connected to the AC changeover switch 13.

In a preferred embodiment, the measurement and automation unit detects a plurality of sets of detection information of the battery pack, and performs a plurality of determinations on the plurality of sets of detection information to obtain a plurality of sets of determination information. Further, the system device respectively switches the AC changeover switch and the DC changeover switch according to the plurality of sets of determination information.

In another preferred embodiment, the measurement and automation unit and the programmable control unit achieve a synchronous counter function in between by using a pulse width modulation (PWM) signal. When abnormality occurs in the measurement and automation unit, the programmable control unit transmits a digital signal to the AC changeover switch to perform disconnection. In a preferred embodiment, the battery pack sends battery information to the measurement and automation unit by a controller region device, and the system device switches the DC changeover switch according to the battery information.

Figure 2:
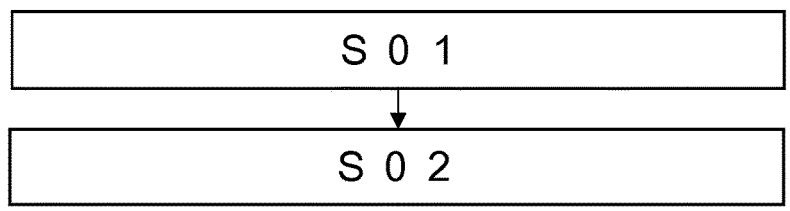
FIG. 2 is a flowchart of a safety protection method for a battery test system according to a preferred embodiment of the present invention.

FIG. 2 shows a flowchart of a safety protection method for a battery test system according to a preferred embodiment of the present invention. The method includes steps S01 and S02.

In step S01, the system device is used to detect in real time a plurality of sets of detection information of the battery pack, and to perform a plurality of determinations on the plurality of sets of detection information to obtain a plurality of sets of determination information, and the system device respectively switches the AC changeover switch and the DC changeover switch according to the plurality of sets of determination information.

In step S02, a measurement and automation unit and a programmable control unit in the system device achieve a synchronous counter function in between by using a pulse width modulation (PWM) signal. When abnormality occurs in the measurement and automation unit, the programmable control unit transmits a digital signal to the AC changeover switch to perform disconnection.

As described above, using the safety protection device and method for a battery test system provided by the present invention, a test apparatus is capable of initiatively performing a power-off mechanism by a protection device in the occurrence of abnormality during testing of a battery, preventing dangers caused by battery malfunction.

In another preferred embodiment, a communication network among elements of the present invention is implemented by a controller area network (CAN or CAN bus) or Ethernet.

In conclusion of the above, using the safety protection device and method for a battery test system provided by the present invention, a test apparatus is capable of initiatively performing a power-off mechanism by a protection device in occurrence of abnormality during testing of a battery, preventing dangers caused by battery malfunction. Thus, the present invention provides battery manufacturers, module manufacturers and system manufacturers with a safety protection mechanism for further reinforcement during testing of battery packs and battery systems.

While the present disclosure has been described by way of specific embodiments, numerous modifications and variations could be made thereto by those skilled in the art without departing from the scope and spirit of the present disclosure set forth in the claims.

What is claimed is:

1. A safety protection method for a battery test system, comprising:

using a system device to detect in real time a plurality of sets of detection information of a battery pack and to perform a plurality of determinations on the plurality of sets of detection information to obtain a plurality of sets of determination information, and the system device respectively switching an alternating current (AC) changeover switch and a direct current (DC) changeover switch according to the plurality of sets of determination information, wherein the system device is coupled to a load device, the AC changeover switch is coupled between an AC source and the system device, and the DC changeover switch is coupled between the battery pack and the system device; and enabling a measurement and automation unit and a programmable control unit of the system device to achieve a synchronous counter function in between by using a pulse width modulation (PWM) signal, and when abnormality occurs in the measurement and automation unit, the programmable control unit transmits a digital signal to the AC changeover switch to perform disconnection.

2. The safety protection method for a battery test system according to claim 1, wherein the battery pack sends battery information to the measurement and automation unit by a controller region device, and the system device switches the DC changeover switch according to the battery information.

\* \* \* \* \*